US006656814B2

United States Patent
Yoo et al.

(10) Patent No.: US 6,656,814 B2
(45) Date of Patent: Dec. 2, 2003

(54) METHODS OF FABRICATING INTEGRATED CIRCUIT DEVICES INCLUDING DISTRIBUTED AND ISOLATED DUMMY CONDUCTIVE REGIONS

(75) Inventors: Kwang-dong Yoo, Kyungki-do (KR); Young-wug Kim, Kyungki-do (KR); Seok-kyun Jung, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 245 days.

(21) Appl. No.: 09/825,179

(22) Filed: Apr. 3, 2001

(65) Prior Publication Data

US 2001/0010387 A1 Aug. 2, 2001

Related U.S. Application Data

(62) Division of application No. 09/343,997, filed on Jun. 30, 1999, now Pat. No. 6,255,697.

(30) Foreign Application Priority Data

Jun. 30, 1998 (KR) .............................. 98-25909

(51) Int. Cl.[7] .............................................. H01L 21/76
(52) U.S. Cl. ...................... 438/400; 438/424; 438/439; 438/453; 438/926
(58) Field of Search ................. 438/424, 439, 438/453, 926, 400

(56) References Cited

U.S. PATENT DOCUMENTS

| | | | | |
|---|---|---|---|---|
| 5,032,890 A | * | 7/1991 | Ushiku et al. ............... 257/211 |
| 5,341,028 A | * | 8/1994 | Yamaguchi et al. ......... 257/344 |
| 5,659,202 A | * | 8/1997 | Ashida ........................ 257/758 |
| 5,923,969 A | | 7/1999 | Oyamatsu .................... 438/183 |
| 5,977,558 A | | 11/1999 | Lee .............................. 257/48 |
| 6,020,616 A | | 2/2000 | Bothra et al. ............... 257/381 |
| 6,103,020 A | * | 8/2000 | Roberts et al. ............. 438/439 |
| 6,103,592 A | | 8/2000 | Levy et al. .................. 438/424 |
| 6,261,883 B1 | * | 7/2001 | Koubuchi et al. .......... 438/598 |
| 6,362,074 B2 | * | 3/2002 | Bohr ........................... 438/424 |

* cited by examiner

Primary Examiner—Michael Trinh
(74) Attorney, Agent, or Firm—Myers Bigel Sibley & Sajovec

(57) ABSTRACT

An integrated circuit device is fabricated by forming at least one isolation region in an area of a semiconductor substrate, such as a monolithic semiconductor substrate or a silicon on insulator (SOI) substrate. The at least one isolation region defines at least one active region. A plurality of dummy conductive regions is distributed in the area of the semiconductor substrate, with the dummy conductive regions being constrained to overlie the at least one isolation region. The dummy conductive regions may be formed from a conductive layer that is also used to form, for example, a gate electrode, a capacitor electrode or a wiring pattern. The dummy conductive regions may be formed on an insulation layer, e.g., a gate insulation layer or an interlayer dielectric layer. Preferably, the dummy conductive regions are non-contiguous. In one embodiment, a lattice-shaped isolation region is formed including an array of node regions linked by interconnecting regions and defining an array of dummy active regions. The plurality of dummy conductive regions are formed on the node regions of the lattice-shaped isolation region. In another embodiment, an array of isolation regions is formed, defining a lattice-shaped dummy active region. An array of dummy conductive regions is formed on the array of isolation regions. Related integrated circuit devices are also described.

8 Claims, 5 Drawing Sheets

METHODS OF FABRICATING INTEGRATED CIRCUIT DEVICES INCLUDING DISTRIBUTED AND ISOLATED DUMMY CONDUCTIVE REGIONS

This application is a divisional of prior application Ser. No. 09/343,997, filed Jun. 30, 1999, U.S. Pat. No. 6,255,697, the disclosure of which is hereby incorporated herein by reference.

FIELD OF THE INVENTION

The present invention relates to integrated circuit devices and methods of fabrication therefor, and more particularly, to integrated circuit devices with dummy conductive regions and methods of fabrication therefor.

BACKGROUND OF THE INVENTION

As the integration density of integrated circuit devices has increased, there is interest in developing techniques for forming isolation regions with reduced area. Trench isolation techniques are commonly used to reduce the area of the isolation region. In a typical trench isolation technique, a trench is etched into a semiconductor substrate, filled with an insulating film, and planarized by chemical mechanical polishing (CMP) to form a trench isolation region. Trench isolation techniques can form small isolation regions, as trenches can be made narrow and deep.

The area or density of the isolation regions in an integrated circuit may vary depending on location in the integrated circuit. For example, the density of active regions is typically lower in peripheral circuit regions than in memory cell array regions. Consequently, isolation regions in peripheral circuit areas typically occupy larger areas than isolation regions in a cell array region.

Relatively large trench isolation regions in peripheral circuit regions may be more subject to "dishing" during CMP, due to the relatively large trench size. In order to reduce dishing, fabrication techniques have been employed that reduce the total area of the isolation region. According to one technique, dummy active regions are formed at predetermined intervals in a large isolation region to reduce the size of the isolation region.

In forming gate lines for transistors in devices such as memory devices, a conductive layer typically is patterned by photolithography. The conductive layer preferably is patterned to achieve a more uniform distribution of conductive regions. Uniformity in the distribution of conductive regions can help ensure a uniform etch rate in longitudinal and latitudinal directions. Because gate lines in the chip may occur at irregular intervals, however, the conductive layer is patterned to form dummy gate lines along with the actual gate lines, particularly in regions having a relatively low gate line density.

Typically, these dummy gate lines are formed with little or no regard for their relationships to other structures in the substrate, such as the dummy active regions described above. Typically, at least a part of the dummy gate line overlaps a dummy active region. If a portion of a dummy active region is overlaid by a dummy gate line with a gate oxide film interposed therebetween, a floating capacitor may be formed. This floating capacitor may provide parasitic capacitance for another neighboring conductive region, e.g. a metal wiring region or a gate electrode. In the case of a dummy gate line lying adjacent an actual gate electrode, such parasitic capacitance may induce a voltage on the adjacent gate electrode that is sufficiently high to change the state of the transistor controlled by the gate electrode. This phenomenon may be particularly pronounced in highly-integrated semiconductor devices having line widths of 0.25 $\mu$m or less.

SUMMARY OF THE INVENTION

In light of the foregoing, it is an object of the present invention to provide integrated circuit devices and methods of fabrication therefor that can provide reduced dishing.

It is another object of the present invention to provide integrated circuit devices and methods of fabrication therefor that can provide dummy conductive structures with less floating capacitance.

These and other objects, features and advantages are provided according to the present invention by integrated circuit devices and fabrication methods therefor in which a plurality of dummy conductive regions are distributed in an area of a substrate and are constrained to overlie at least one isolation region that defines at least one dummy active region, i.e., such that the dummy conductive regions do not overlie the at least one dummy active region. The at least one isolation region may be formed, for example, by trench isolation or field oxide techniques. The dummy conductive regions may be formed, for example, from the same conductive layer used to form gate electrodes, capacitor electrodes, wiring patterns, or the like. In one embodiment according to the present invention, the at least one isolation region comprises a lattice-shaped isolation region defining an array of dummy active regions, and the plurality of dummy conductive regions comprises an array of dummy conductive regions disposed on node regions of the lattice-shaped isolation region. In another embodiment, the at least one isolation region includes an array of isolation regions that define a lattice-shaped dummy active region, and the plurality of dummy conductive regions comprises an array of dummy conductive regions disposed on the array of isolation regions.

When the at least one isolation region is formed by a trench isolation technique, distribution of the at least one isolation region in the form of a lattice or array interspersed among at least one dummy active region can help to reduce dishing in the formation of the at least one isolation region. Constraining dummy conductive regions to overlie the at least one isolation region can help reduce the creation of floating capacitances that can deleteriously affect device operation.

In particular, according to the present invention, an integrated circuit device is fabricated by forming at least one isolation region in an area of a semiconductor substrate, for example, a monolithic semiconductor substrate or a composite substrate such as a silicon on insulator (SOI) substrate. The at least one isolation region defines at least one active region. A plurality of dummy conductive regions is distributed in the area of the semiconductor substrate, with the dummy conductive regions being constrained to overlie the at least one isolation region. The dummy conductive regions may be formed, for example, from a conductive layer that is also used to form a gate electrode, a capacitor electrode or a wiring pattern. The dummy conductive regions may be formed on an insulation layer, e.g., a gate insulation layer or an interlayer dielectric layer, that is formed on the substrate and covers the at least one isolation region and the at least one active region. Preferably, the dummy conductive regions are noncontiguous.

In one embodiment according to the present invention, a lattice-shaped isolation region is formed. The lattice-shaped isolation region includes an array of node regions linked by interconnecting regions, defining an array of dummy active regions. A plurality of dummy conductive regions are formed on the node regions of the lattice-shaped isolation region.

In another embodiment according to the present invention, an array of isolation regions is formed. The array of isolation regions defines a lattice-shaped dummy active region. An array of dummy conductive regions is formed on the array of isolation regions. A respective dummy conductive region may be formed on a respective one of the isolation regions of the array, or respective plurality dummy conductive regions may be formed on a respective one of the isolation regions of the array.

Related integrated circuit devices are also described.

DETAILED DESCRIPTION OF PREFERRED EMBODIMENTS

Figure 1:
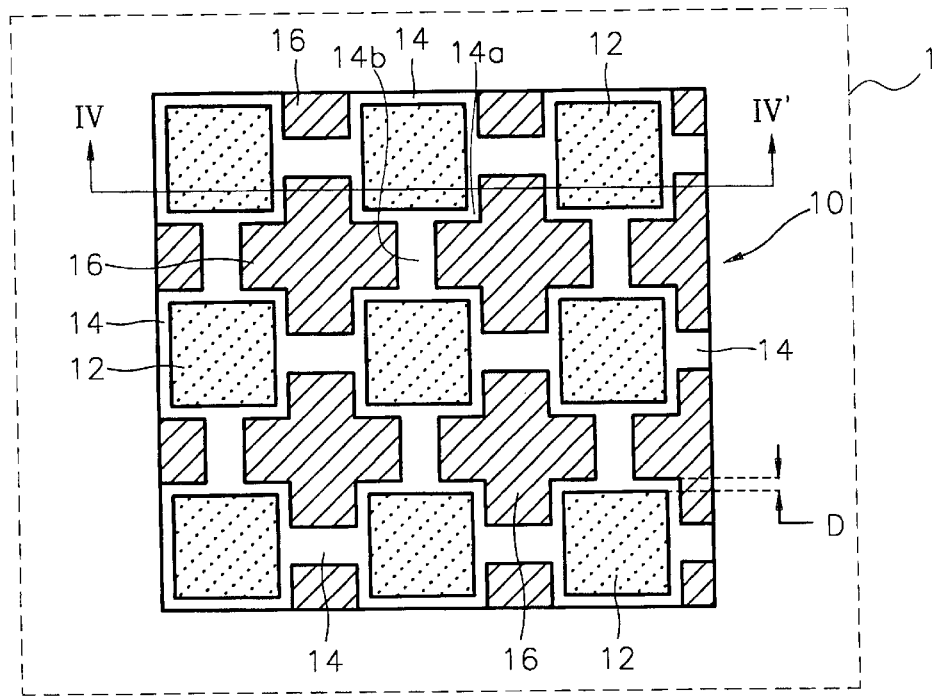
FIG. 1 is a plan view illustrating distributed dummy conductive regions in an integrated circuit device according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Referring to FIG. 1, an integrated circuit device 1 according to the present invention includes dummy active regions 12 formed on a field region 10, an isolation region 14 formed in a portion of the field region 10 other than the dummy active region 12, and dummy conductive regions 16 formed only on the isolation region 14. The dummy conductive regions 16 do not electrically contact the dummy active regions 12.

The dummy conductive regions 16 may, for example, be formed from the same conductive layer used to form a gate electrode, e.g., from a doped polysilicon layer or a polycide structure. In other embodiments, the dummy conductive regions 16 may be formed from a metal layer, e.g., tungsten or aluminum, used to form a wiring pattern. In still other embodiments, the dummy conductive regions 16 may be formed from a conductive layer used to form an electrode of a capacitor. The dummy conductive regions 16 are constrained to overlie the isolation region 14, without contacting the dummy active regions 12, and are spaced apart from the dummy active regions 12 by a distance D that preferably is 1 $\mu$m or greater.

In FIG. 1, the isolation region 14 is formed in the shape of a lattice, and includes node regions 14a over which the dummy conductive regions 16 are formed. The node regions 14a are connected by interconnecting regions 14b. The dummy active regions 12 are rectangular in shape, and form an array within the lattice-shaped isolation region 14. The dummy conductive regions 16 are distributed such that a respective dummy conductive region 16 overlies a respective one of the node regions 14a.

Figure 2:
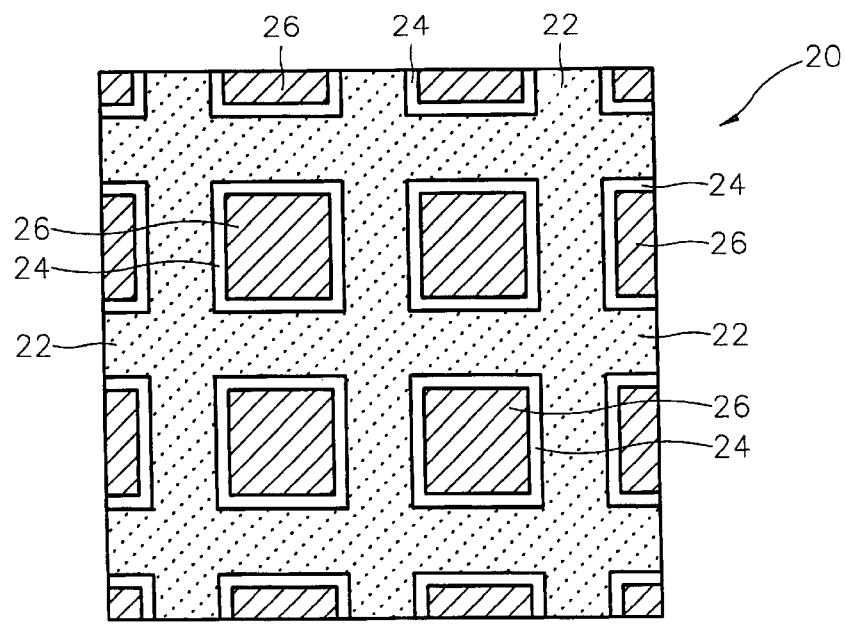
FIG. 2 is a plan view illustrating distributed dummy conductive regions in an integrated circuit device according to another embodiment of the present invention.

FIG. 2 illustrates another embodiment according to the present invention which utilizes a different configuration. A dummy active region 22 having a lattice shape is defined in field region 20 by an array of isolation regions 24 formed in the field region 20. Dummy conductive regions 26 are distributed such that a respective one of the dummy conductive regions 26 overlies a respective one of the isolation regions 24.

Figure 3:
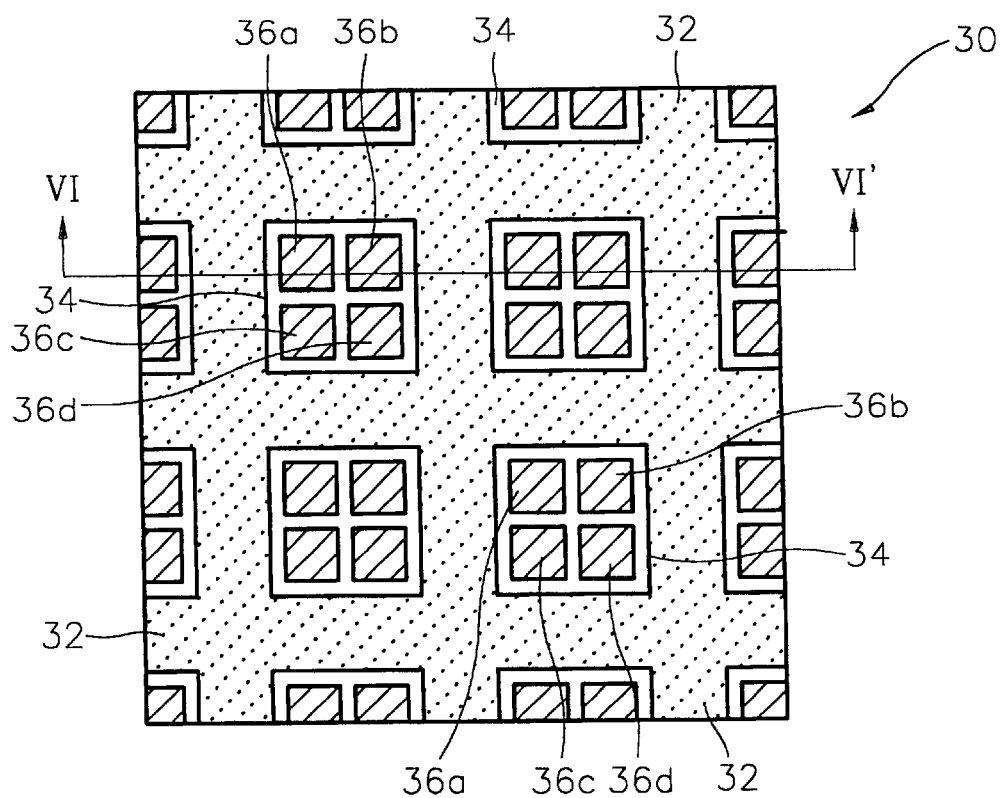
FIG. 3 is a plan view illustrating distributed dummy conductive regions in an integrated circuit device according to yet another embodiment of the present invention.

FIG. 3 shows yet another configuration according to another embodiment of the present invention. Respective pluralities of rectangular dummy conductive regions 36a, 36b, 36c, 36d are formed on respective ones of a plurality of rectangular isolation regions 34 that define a lattice-shaped active region 32 in a field region 30.

Figure 4A:
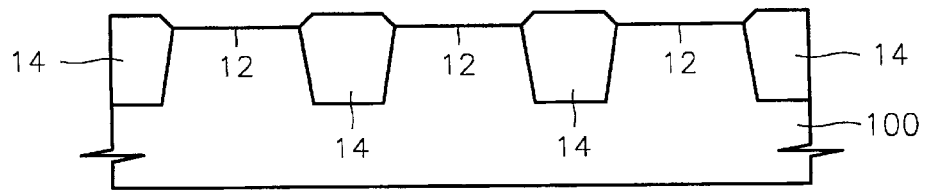
FIGS. 4A–4D are cross-sectional views illustrating exemplary operations for forming dummy conductive regions in an integrated circuit device according to an embodiment of the present invention.

FIGS. 4A–4D illustrate exemplary fabrication operations and intermediate fabrication products according to an embodiment of the present invention, in particular, cross-sections taken at the line IV–IV' of FIG. 1. Referring to FIG. 4A, isolation regions 14 are formed on parts of a field region of a semiconductor substrate 100 by a trench isolation method. The isolation regions 14 define dummy active regions 12 in the semiconductor substrate 100, distributing dummy active regions 12 to help reduce dishing when planarizing the isolation regions 14.

Figure 4B:
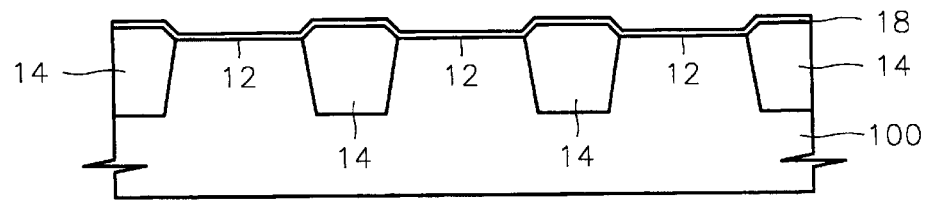
Figure 4C:
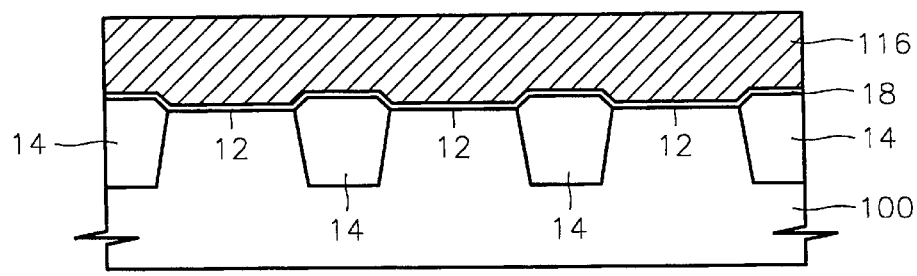

Referring to FIG. 4B, an insulation layer 18, e.g., a gate insulation layer or an interlayer insulation layer 18, is formed on the semiconductor substrate 100, covering the isolation regions 14. Referring to FIG. 4C, a conductive layer 116 is then formed on the insulation layer 18. The conductive layer 116 may be a conductive layer used to form, for example, a gate electrode, capacitor electrode, or wiring pattern.

Figure 4D:
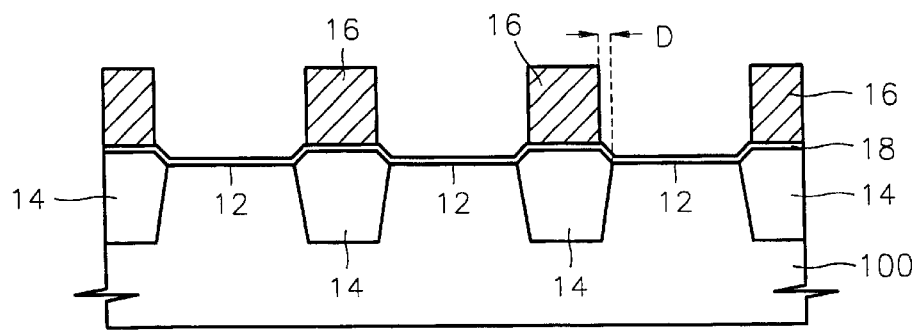

Referring to FIG. 4D, dummy conductive regions 16 are formed by patterning the conductive layer 116. Portions of the conductive layer 116 overlying the dummy active regions 12 are completely removed, such that the dummy conductive regions 16 are constrained to overlie the isolation regions 14. The dummy conductive regions 16 are spaced from the dummy active regions 12 by a distance (D) that preferably is at least 1 μm. In addition, the dummy conductive regions 16 preferably are spaced at least 1 μm from other conductive regions (not shown) formed on the semiconductor substrate 100. As the dummy conductive regions 16 are constrained to overlie the isolation regions 14, formation of floating capacitance is reduced.

Figure 5:
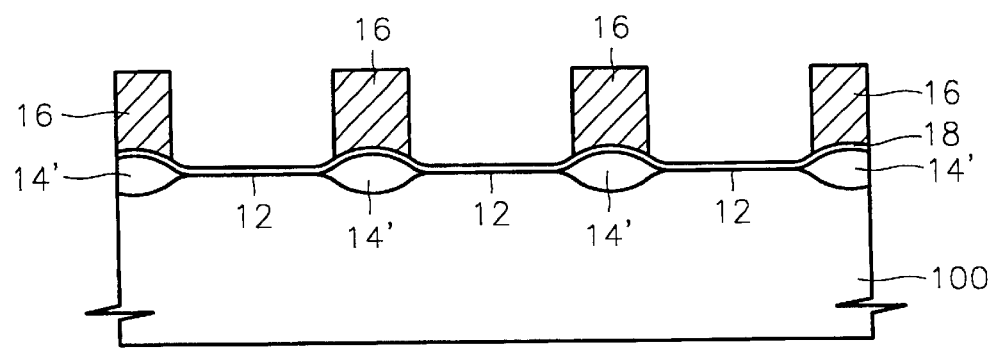
FIG. 5 is a cross-sectional view illustrating exemplary operations for fabricating dummy conductive regions in an integrated circuit device according to another embodiment of the present invention.

FIG. 5 is a cross-sectional view illustrating an alternative embodiment according to the present invention. In this embodiment, isolation regions 14' are field oxide isolation regions formed by LOCOS (local oxidation of silicon). The field isolation regions 14' define a plurality of dummy active regions 12 in manner similar to that described in reference to FIGS. 4A–4D. An insulation layer 18 is formed on the substrate 100, covering the isolation regions 14.' A conductive layer is formed in a manner similar to that described in reference to FIGS. 4A–4D, and patterned to form a plurality of dummy conductive regions 16 that are constrained to overlie the field isolation regions 14.'

Figure 6:
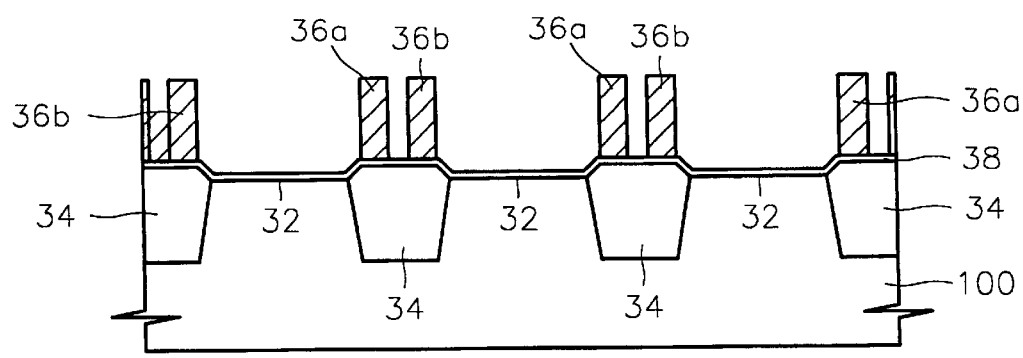
FIG. 6 is a cross-sectional view illustrating exemplary operations for fabricating dummy conductive regions in an integrated circuit device according to another embodiment of the present invention.

FIG. 6 is a cross-sectional view illustrating yet another embodiment of the present invention, in particular, a cross-section view corresponding to the line VI–VI' of FIG. 3. As with the structure of FIGS. 4A–4D, a plurality of trench isolation regions 34 are formed in a semiconductor substrate 100, defining a plurality of dummy active regions 32. An insulation layer 38 is formed on the substrate 100, overlying the isolation regions 34. A conductive layer is formed on the dielectric layer, and patterned to form a plurality of dummy conductive regions 36a, 36b, wherein multiple dummy conductive regions 36a, 36b overlie a respective isolation region 34.

Figure 7A:
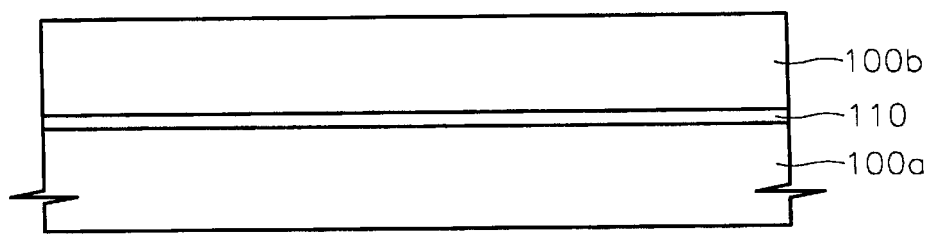
FIGS. 7A–7C are cross-sectional views illustrating operations for fabricating an integrated circuit device according to yet another embodiment of the present invention.
Figure 7B:
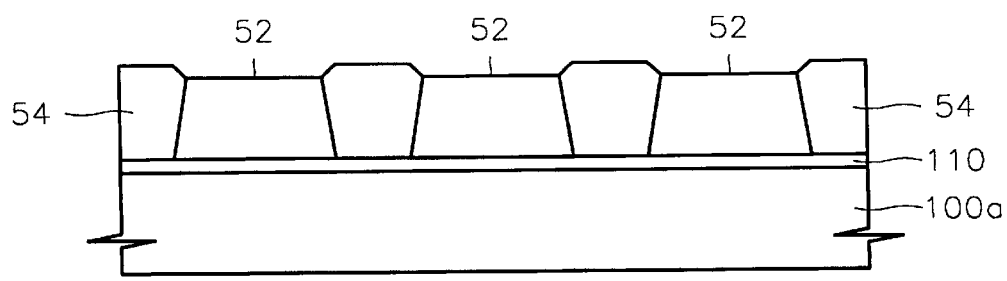
Figure 7C:
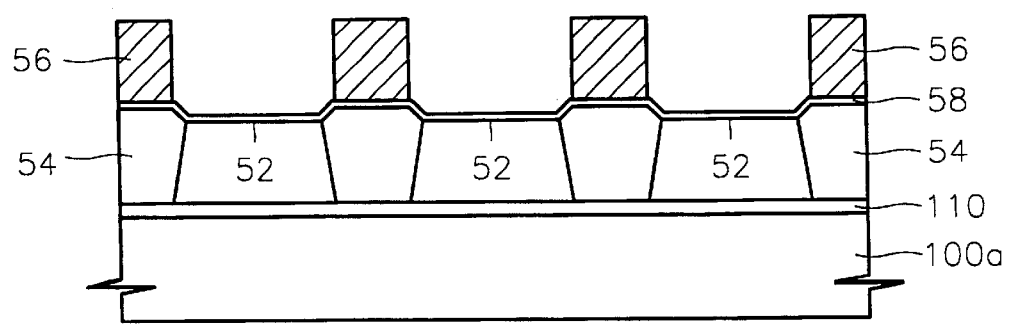

FIGS. 7A through 7C are cross-sectional views illustrating yet another embodiment according to the present invention. Referring to FIG. 7A, an oxide layer 110 is formed on a first silicon layer 100a, and a second silicon layer 100b is adhered to the upper surface of the oxide layer 110, forming a silicon on insulator (SOI) structure. Referring to FIG. 7B, a trench is formed in the second layer 100b, exposing portions of the oxide layer 110. Isolation regions 54 are formed in the trenches by filing the trenches with an insulation layer and planarizing by CMP. The isolation regions 54 define dummy active regions 52. Referring to FIG. 7C, an insulation layer 18 is formed on the resultant structure, covering the isolation regions 54, and a conductive layer is formed on the insulation layer 58. The conductive layer is patterned to form a plurality of dummy conductive regions 56 that are constrained to overlie the isolation regions 54.

According to the present invention, dishing is reduced when trench isolation regions are formed by distributing dummy active regions at a predetermined density on the field region of a semiconductor device. Dummy conductive regions are also distributed across the field region, which can aid in achieving uniform etching when a conductive layer is patterned to form structures such as gate electrodes, capacitor electrodes or wiring patterns. As the dummy conductive regions are constrained to overlie isolation regions, generation of floating capacitance can be reduced, helping to prevent malfunctions arising from parasitic capacitance effects in highly integrated circuit devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of fabricating an integrated circuit device, the method comprising:

forming a lattice-shaped isolation region in a semiconductor substrate, the lattice-shaped isolation region comprising an array of node regions linked by interconnecting regions; and forming an array of dummy conductive regions on the node regions of the lattice-shaped isolation region, the respective dummy conductive regions overlying respective ones of the node regions of the lattice-shaped isolation region.

2. A method according to claim 1, wherein said step of forming a lattice-shaped isolation region comprises the step of forming at least one of a trench isolation region and a field oxide isolation region.

3. A method according to claim 1:

wherein said step of forming a lattice-shaped isolation region is preceded by the steps of forming a silicon on insulator (SOI) substrate comprising a first semiconductor layer, an insulation layer on the first semiconductor layer, and a second semiconductor layer on the insulation layer; and wherein said step of forming a lattice-shaped isolation region comprises forming the lattice-shaped isolation region on the second semiconductor layer.

4. A method of fabricating an integrated circuit device, the method comprising:

forming an array of isolation regions defining a lattice-shaped dummy active region in a semiconductor substrate; and forming an array of dummy conductive regions on the array of isolation regions, respective ones of the dummy conductive regions constrained to overlie respective ones of the isolation regions.

5. A method according to claim 4, wherein said step of forming an array of dummy conductive regions comprises the step of forming a single dummy conductive region on each of the isolation regions of the array of isolation regions.

6. A method according to claim 4, wherein said step of forming an array of dummy conductive regions comprises the step of forming a respective plurality of dummy conductive regions on a respective one of the isolation regions of the array of isolation regions.

7. A method according to claim 4, wherein said step of forming an array of isolation regions comprises the step of forming at least one of a trench isolation region and a field oxide isolation region.

8. A method according to claim 4:

wherein said step of forming an array of isolation regions is preceded by the steps of forming a silicon on insulator (SOI) substrate comprising a first semiconductor layer, an insulation layer on the first semiconductor layer, and a second semiconductor layer on the insulation layer; and wherein said step of forming an array of isolation regions comprises forming the array of isolation regions on the second semiconductor layer.

* * * * *